(12) United States Patent
Huang et al.

(10) Patent No.: US 12,432,914 B2
(45) Date of Patent: Sep. 30, 2025

(54) NON-VOLATILE MEMORY STRUCTURE AND METHOD FOR FORMING THE SAME

(71) Applicant: Winbond Electronics Corp., Taichung (TW)

(72) Inventors: Tzu-Yun Huang, Taichung (TW); Chun-Hsu Chen, Taichung (TW)

(73) Assignee: Winbond Electronics Corp., Taichung (TW)

( * ) Notice: Subject to any disclaimer, the term of this patent is extended or adjusted under 35 U.S.C. 154(b) by 468 days.

(21) Appl. No.: 18/072,307

(22) Filed: Nov. 30, 2022

(65) Prior Publication Data
US 2024/0179898 A1     May 30, 2024

(51) Int. Cl.
*H01L 29/788* (2006.01)
*H10B 41/30* (2023.01)
*H10D 30/01* (2025.01)

(52) U.S. Cl.
CPC ......... *H10B 41/30* (2023.02); *H10D 30/0243* (2025.01)

(58) Field of Classification Search
CPC ........... H10D 84/0142; H10D 30/0243; H10D 41/30; H10D 43/30
See application file for complete search history.

(56) References Cited

U.S. PATENT DOCUMENTS

2014/0001569 A1* 1/2014 Hafez ............... H01L 21/02164
                                             257/E27.06
2017/0330889 A1* 11/2017 Richter ................. H10B 41/50

FOREIGN PATENT DOCUMENTS

CN        114068524 A     2/2022

* cited by examiner

*Primary Examiner* — John A Bodnar
(74) *Attorney, Agent, or Firm* — MUNCY, GEISSLER, OLDS & LOWE, P.C.

(57) ABSTRACT

A non-volatile memory structure includes a substrate and a gate stack layer over the substrate. The gate stack layer includes an active pattern and a rail block. The active pattern includes several first active stacks and several second active stacks. The first active stacks and the second active stacks are arranged separately in the first direction, and they extend in the second direction. The second direction is different from the first direction. The rail block extends in the first direction. The rail block has a first side and a second side. The second side is opposite the first side. The first active stacks connect the first side of the rail block. The second active stacks connect the second side of the rail block. Also, the first side of the rail block includes several first protruding portions arranged separately in the first direction.

9 Claims, 10 Drawing Sheets

NON-VOLATILE MEMORY STRUCTURE AND METHOD FOR FORMING THE SAME

BACKGROUND

Technical Field

The disclosure relates to a non-volatile memory structure and methods for forming the same, and it relates to a flash memory structure and methods for forming the same.

Description of the Related Art

In recent years, as the manufacturing technology of flash memory structure continues to develop toward the miniaturization of device sizes, many challenges have arisen. For example, after several pattern transfer processes are performed, the connecting portions between a stack block and several long column-shaped active stacks in a memory structure may be too narrow or even completely disconnected. The contacts that are subsequently disposed on the stack block cannot be stably or even successfully coupled to gate electrodes of these active stacks. Thus, although existing non-volatile memory structures and methods for forming the same have generally been adequate for their intended purposes, they have not been entirely satisfactory in all respects. The industry still needs to improve the methods for forming non-volatile memory structures to overcome the problems that are caused by reductions in device size.

SUMMARY

Some embodiments of the present disclosure provide a non-volatile memory structure. A non-volatile memory structure includes a substrate and a gate stack layer over the substrate. The gate stack layer includes an active pattern and a rail block. The active pattern includes several first active stacks and several second active stacks. The first active stacks and the second active stacks are arranged separately in the first direction, and they extend in the second direction. The second direction is different from the first direction. The rail block extends in the first direction. The rail block has a first side and a second side. The second side is opposite the first side. The first active stacks connect the first side of the rail block. The second active stacks connect the second side of the rail block. The first side of the rail block includes several first protruding portions arranged separately in the first direction.

Some embodiments of the present disclosure provide methods for forming a non-volatile memory structure. A method for forming a non-volatile memory structure includes providing a substrate. The method includes sequentially forming an active layer, a hard mask layer, and a mandrel pattern over the substrate. The method includes forming spacers on sidewalls of the mandrels of the mandrel pattern. The method includes removing the mandrel pattern, leaving the spacers to remain on the hard mask layer. The method includes providing a patterned photoresist layer over the spacers. The patterned photoresist layer includes a main portion and several wing portions. The main portion extends in the first direction. The wing portions connect the first side of the main portion and are arranged separately in the first direction. The wing portions protrude in the second direction, which is different from the first direction. The method further includes etching the hard mask layer according to the patterned photoresist layer and the spacers, in order to form a hard mask pattern. The method further includes transferring the hard mask pattern to the active layer, in order to form a gate stack layer.

A detailed description is given in the following embodiments with reference to the accompanying drawings.

BRIEF DESCRIPTION OF THE DRAWINGS

The embodiments of the disclosure can be more fully understood by reading the subsequent detailed description and examples with references made to the accompanying drawings. For clarity of illustration, various elements in the drawings may not be drawn to scale, wherein:

FIG. 1A, FIG. 1B, FIG. 1C, FIG. 1D, FIG. 1E, FIG. 1F, FIG. 1F-1, FIG. 1F-2, FIG. 1F-3, FIG. 1G, FIG. 1G-1, FIG. 1G-2, FIG. 1H, FIG. 1I, FIG. 1I-1 and FIG. 1I-2 illustrate intermediate stages of a method for manufacturing a non-volatile memory structure in accordance with an embodiment of the present disclosure.

DETAILED DESCRIPTION

Figure 1A:
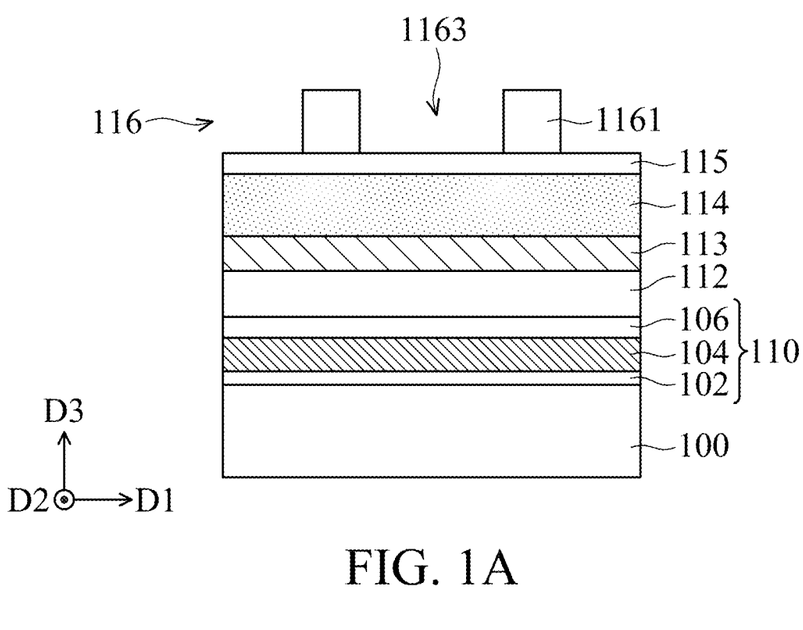
Figure 1B:
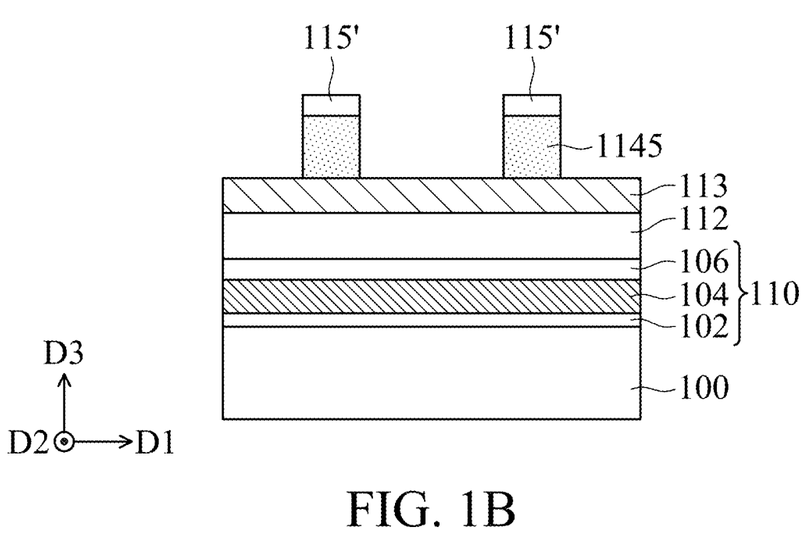
Figure 1C:
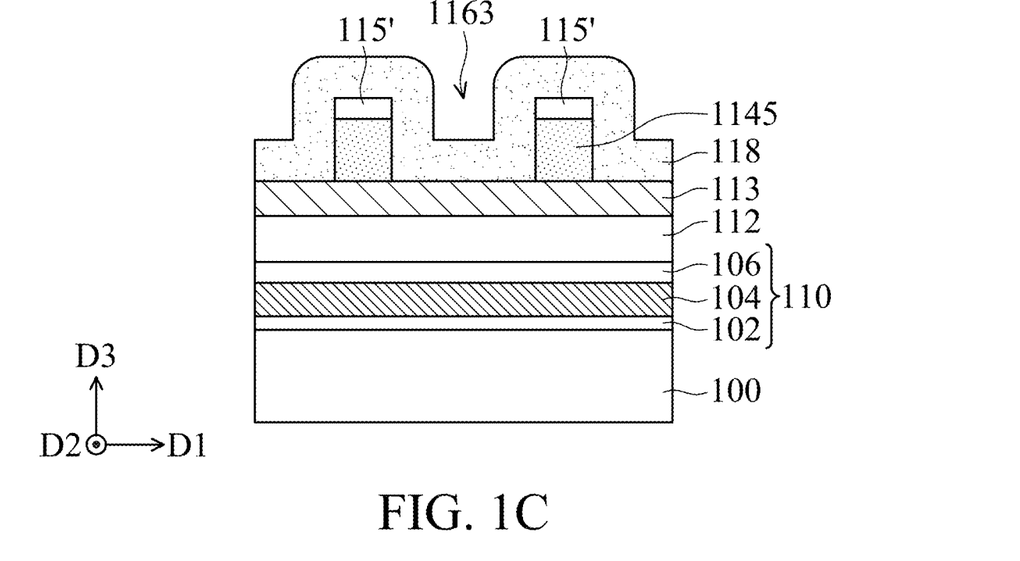
Figure 1D:
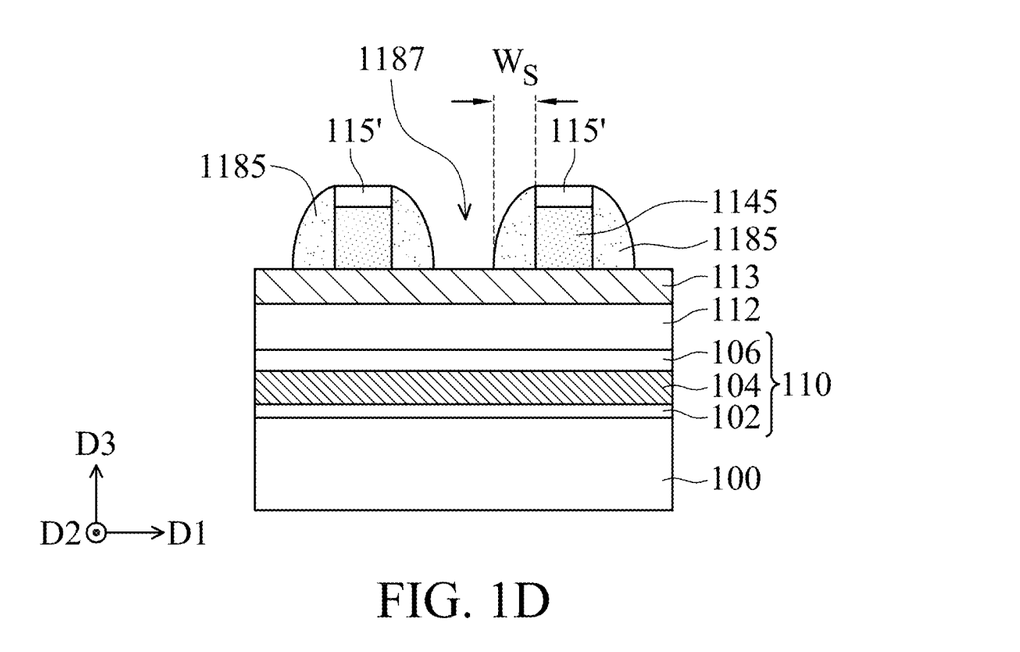
Figure 1E:
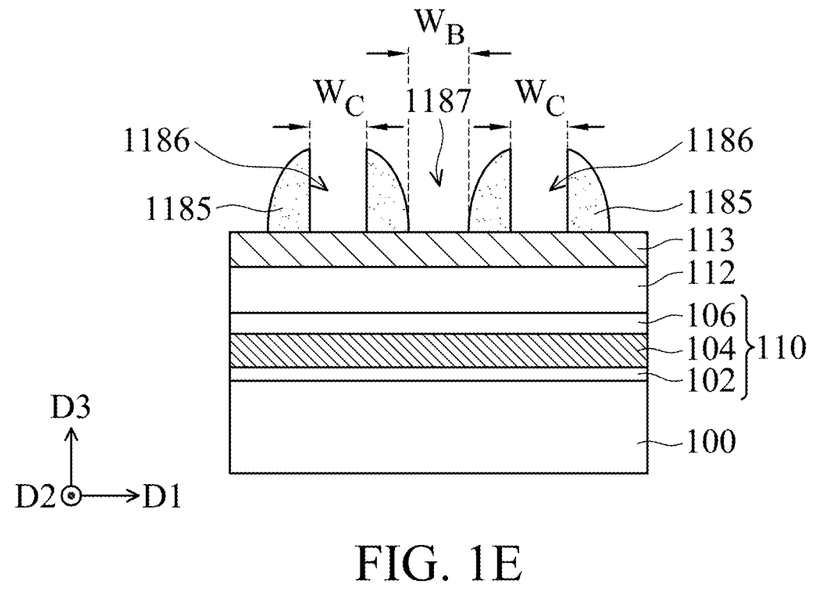
Figure 1F:
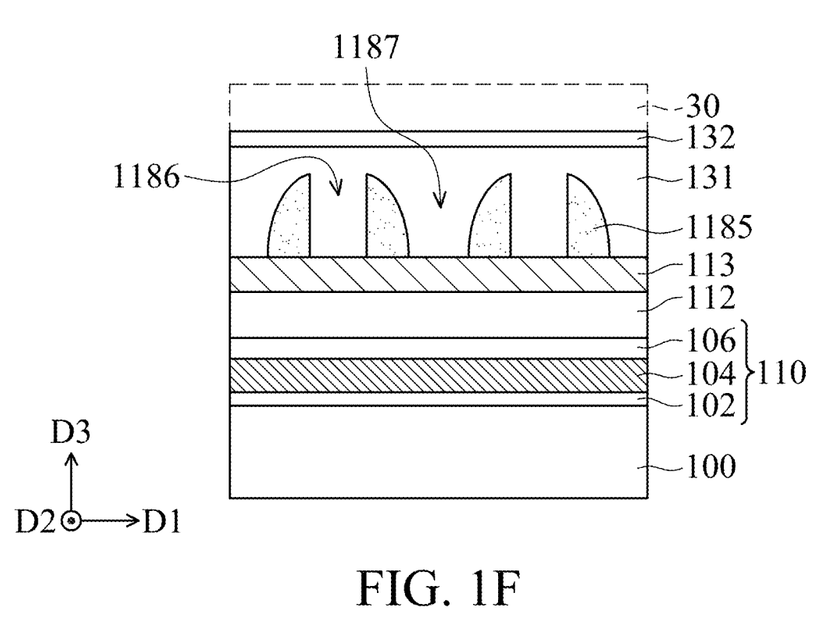
Figure 1F:
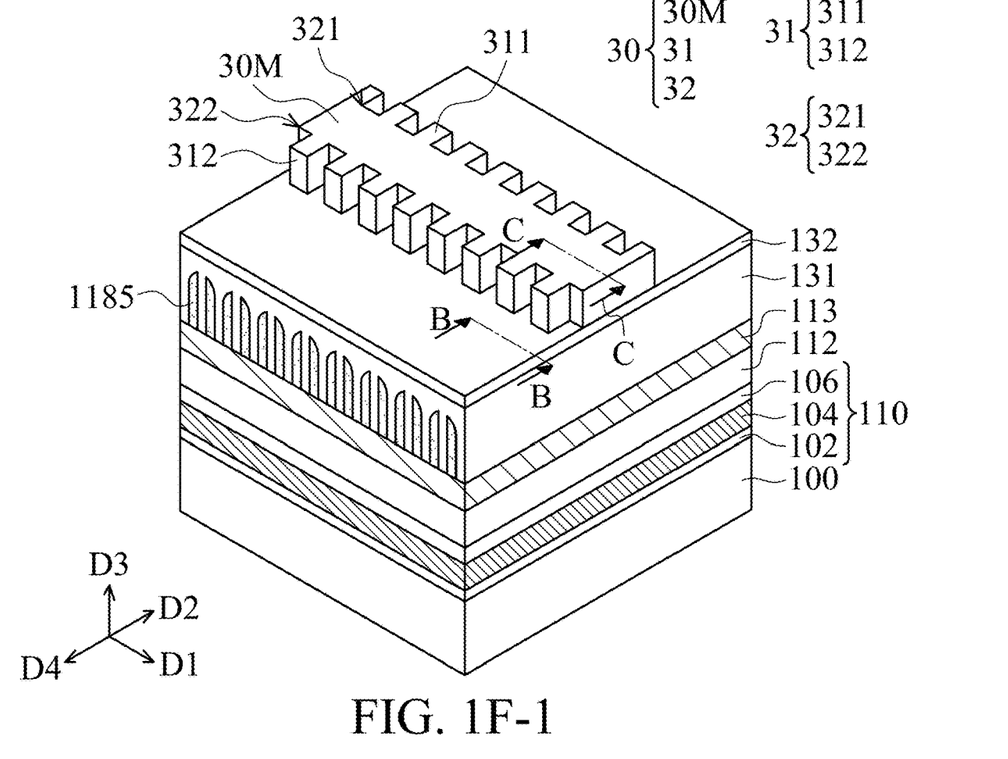
Figure 1F:
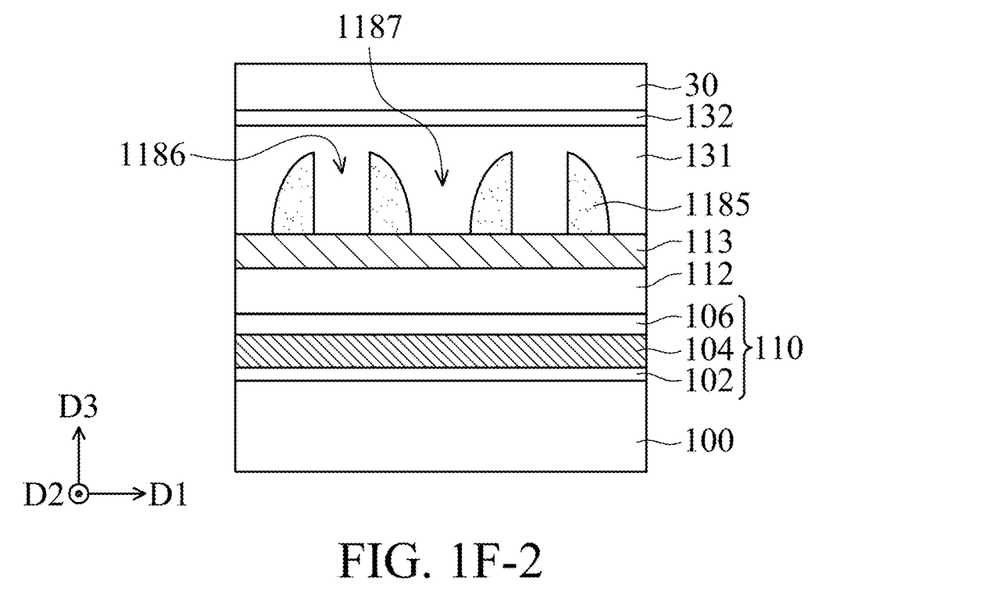
Figure 1F:
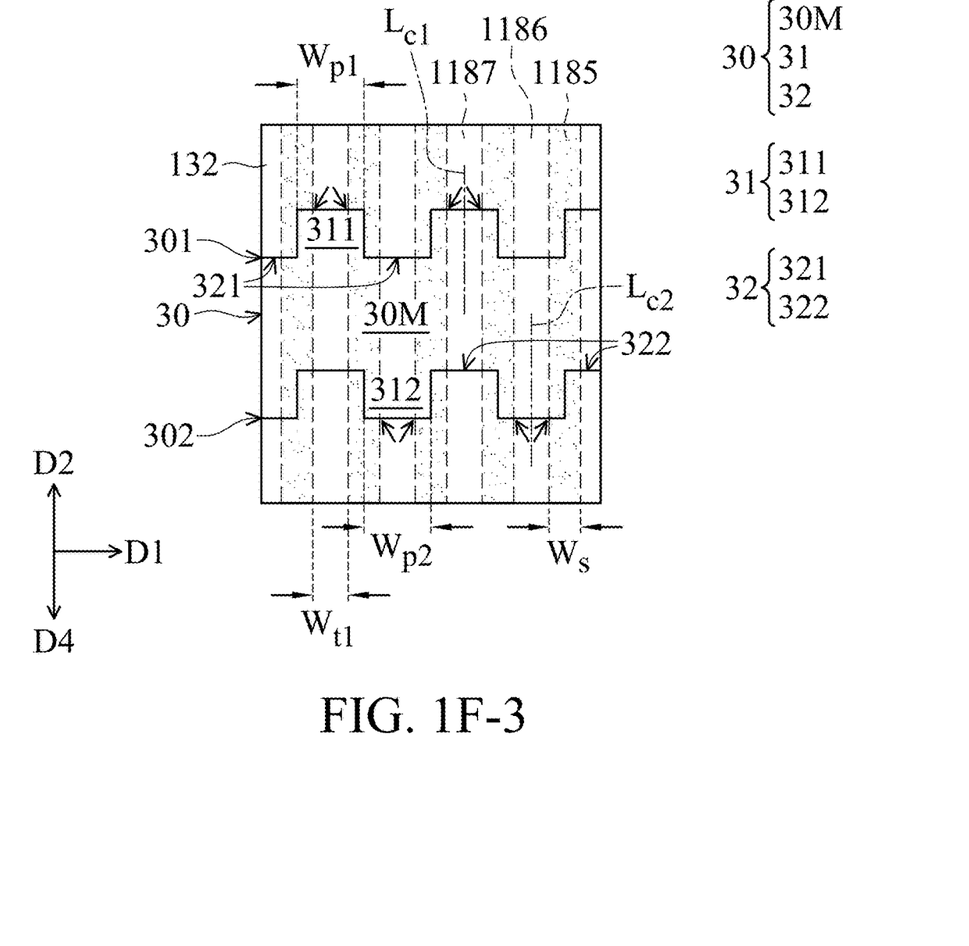
Figure 1G:
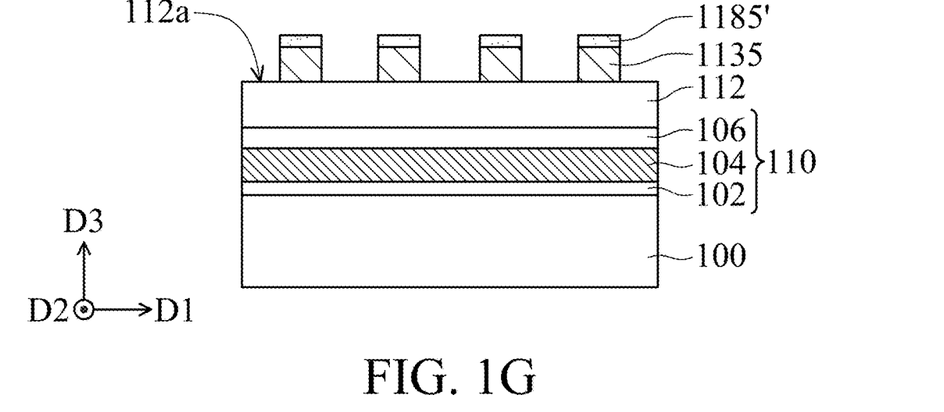
Figure 1G:
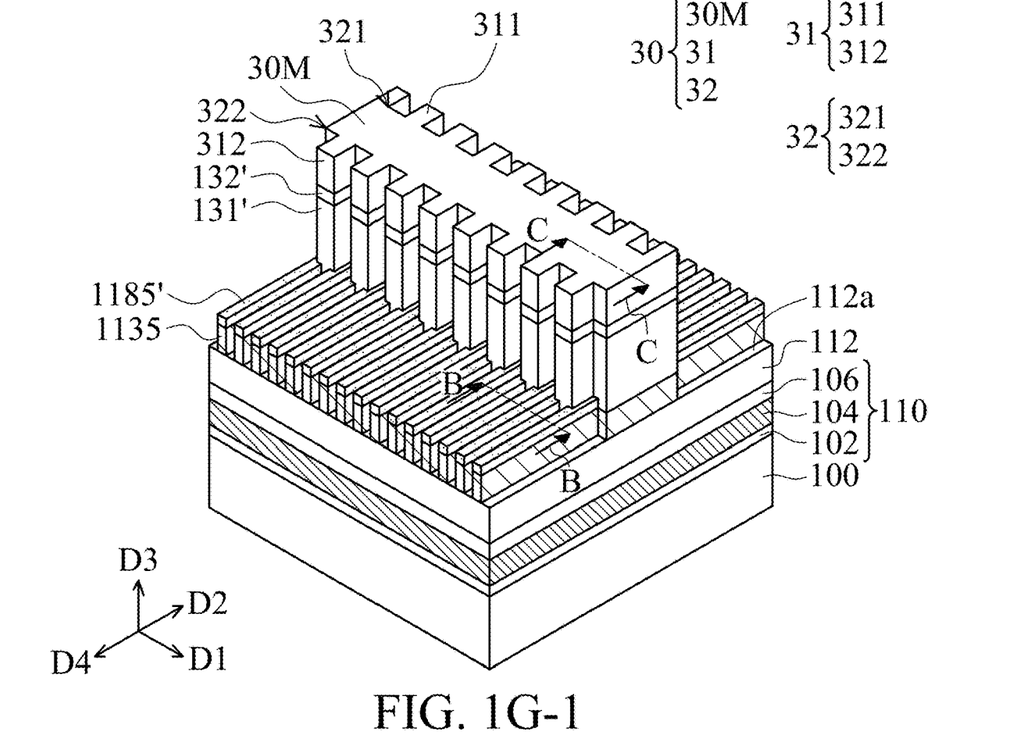
Figure 1G:
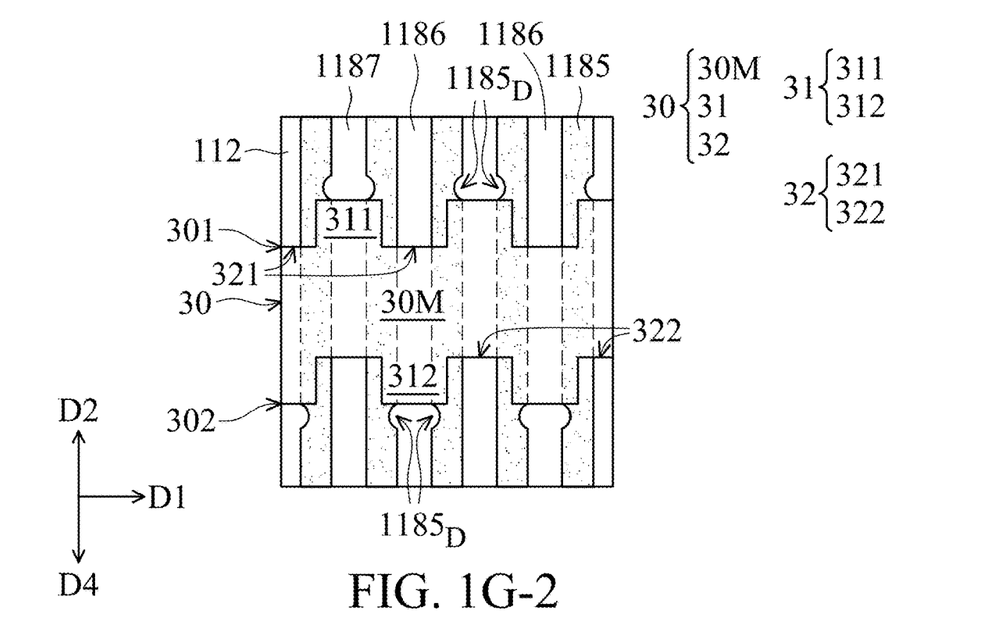
Figure 1H:
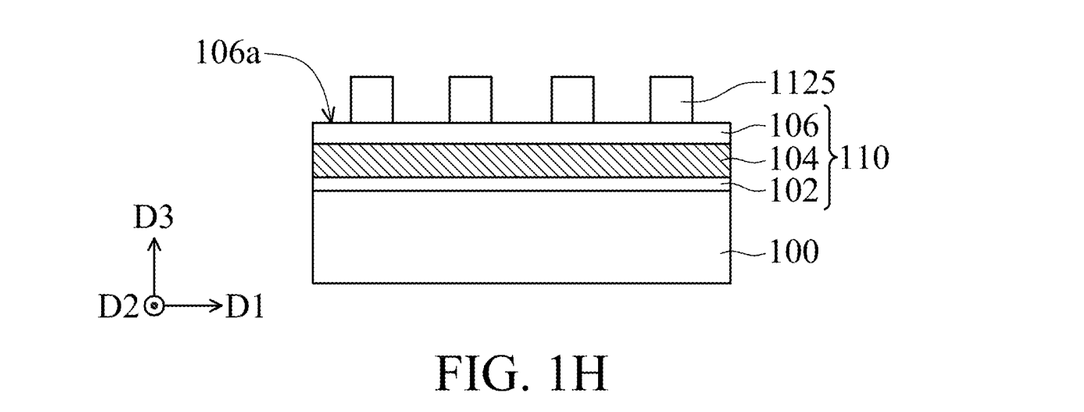
Figure 1I:
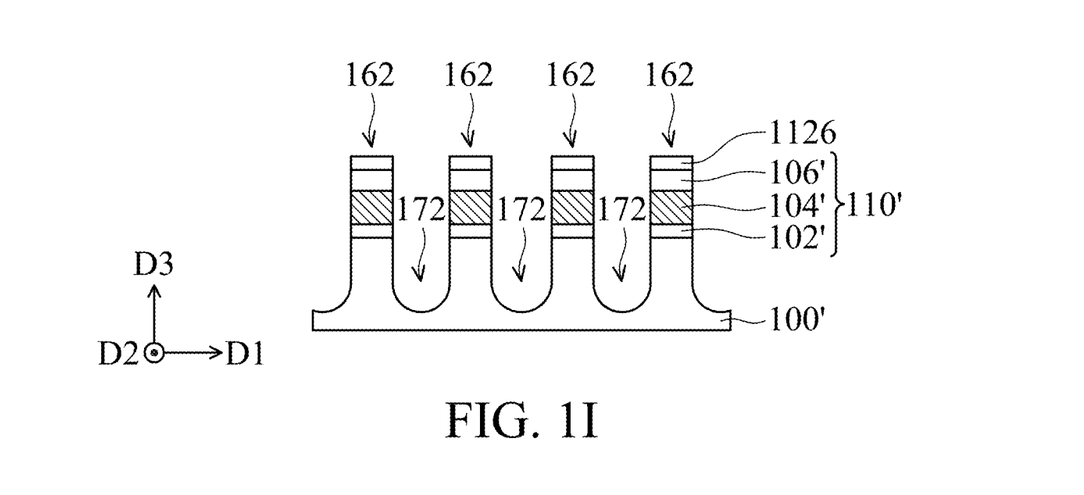

FIG. 1A-FIG. 1I illustrate intermediate stages of a method for manufacturing a non-volatile memory structure in accordance with an embodiment of the present disclosure. FIG. 1F is a cross-sectional view taken along line B-B in the perspective view of the structure of FIG. 1F-1. FIG. 1F-2 is a cross-sectional view taken along line C-C in the perspective view of the structure of FIG. 1F-1. FIG. 1F-3 is a top view of a part of the structure of FIG. 1F-1. FIG. 1G-1 is a perspective view of an intermediate stage of a method for manufacturing a non-volatile memory structure in accordance with an embodiment of the present disclosure. FIG. 1G is a cross-sectional view taken along line B-B in the perspective view of the structure of FIG. 1G-1. FIG. 1G-2 is a top view of a part of the structure of FIG. 1G-1. FIG. 1I is a cross-sectional view taken along line B-B in the perspective view of the structure of FIG. 1I-1. FIG. 1I-2 is a top view of a part of the structure of FIG. 1I-1.

Referring to FIG. 1A, a substrate 100, such as a semiconductor substrate, is provided. In one embodiment, the substrate 100 is an elemental semiconductor substrate, such as a silicon substrate, or a germanium substrate. In one embodiment, the substrate 100 is a compound semiconductor substrate, such as a silicon carbide substrate, or a gallium arsenide substrate. In one embodiment, the substrate 100 is a silicon-on-insulator (SOI) substrate.

Next, an active layer 110 is formed over the substrate 100. The active layer 110 is a stack that includes several material layers. In one embodiment, the active layer 110 includes a tunnel oxide layer 102, a conductive layer 104 and a silicon nitride layer 106 that are sequentially formed over the substrate 100. The tunnel oxide layer 102 may include, for example, silicon oxide or a high dielectric constant (high-k) material (e.g., k>4). The high dielectric constant material may include, for example, hafnium oxide, hafnium silicon oxide, hafnium aluminum oxide, hafnium tantalum oxide, or another suitable high dielectric constant material. The conductive layer 104 may include, for example, polysilicon or doped polysilicon.

Referring to FIG. TA again, a hard mask layer 112, another hard mask layer 113, a sacrificial mandrel layer 114 and an anti-reflection layer 115 are sequentially formed over the active layer 110, in accordance with some embodiments of the present disclosure. The hard mask layer 112 may include a dielectric material, such as silicon oxide, silicon nitride, silicon oxynitride, or a combination of the forgoing materials. In one embodiment, the hard mask layer 112 includes tetraethoxysilane (TEOS). The hard mask layer 113 may include polysilicon. The sacrificial mandrel layer 114 may include a carbon-rich material, such as a carbon layer or spin-on carbon. The anti-reflection layer 115 may include a silicon-rich material, such as silicon oxynitride.

Next, referring to FIG. TA again, a patterned photoresist layer 116 is formed over the anti-reflection layer 115. The patterned photoresist layer 116 includes several photoresists 1161 that are disposed in an array region of a memory structure, and several openings 1163 that are formed between the photoresists 1161, in accordance with some embodiments of the present disclosure.

Next, an etching process is performed on the anti-reflection layer 115 and the sacrificial core layer 114 that are under the patterned photoresist layer 116 using the patterned photoresist layer 116 as a mask. The portions of the anti-reflection layer 115 and the sacrificial core layer 114 that are not covered by the patterned photoresist layer 116 (i.e. the portions corresponding to the openings 1163) are removed until the upper surface of the hard mask layer 113 is exposed, as shown in FIG. 1B. In this exemplified embodiment, after the etching process, an anti-reflection layer 115' and mandrel patterns 1145 are formed. The patterned photoresist layer 116 may be completely consumed in the etching process, or may be removed by an additional ashing process. In one embodiment, the aforementioned etching process is a dry etching process. In addition, after the etching process is performed, the mandrel patterns 1145 can be subjected to a trimming process in order to reduce defects on the surface of the memory structure, in accordance with an embodiment of the present disclosure.

Referring to FIG. 1C, a spacer material layer 118 is formed on the hard mask layer 113. The spacer material layer 118 conformably covers the hard mask layer 113, the mandrel patterns 1145 and the anti-reflection layer 115', in accordance with some embodiments of the present disclosure. As shown in FIG. 1C, the spacer material layer 118 is deposited in the openings 1163 but does not fully fill the openings 1163. The spacer material layer 118 may include a dielectric material, such as silicon oxide, silicon oxynitride, silicon nitride, another suitable material or a combination of the forgoing materials. The spacer material layer 118 may be formed by using chemical vapor deposition, or another suitable method.

Referring to FIG. 1D, portions of the spacer material layer 118 are removed to form spacers 1185 and gaps 1187 between the spacers 1185. The spacers 1185 are, for example, formed on the sidewalls of the mandrel patterns 1145 and the sidewalls of the anti-reflection layer 115'. The gaps 1187 are formed in the openings 1163 (FIG. 1C) and expose parts of the upper surface of the hard mask layer 113. Parts of the spacer material layer 118 may be removed by, for example, a dry etching process.

Referring to FIG. 1E, the anti-reflection layer 115' and the mandrel patterns 1145 are removed to form gaps 1186, in accordance with some embodiments of the present disclosure. The gaps 1186 expose parts of the upper surface of the underlying hard mask layer 113. The method for removing the mandrel patterns 1145 may include, for example, a dry etching process.

Referring to FIG. 1E, the bottom of each of the gaps 1186 has a width of $W_C$ in direction D1, and the bottom of each of the gaps 1187 has a width of $W_B$ in direction D1. In this exemplified embodiment, the width $W_C$ of the bottom of the gap 1186 is substantially equal to the width $W_B$ of the bottom of the gap 1187. In some other embodiments, the width $W_C$ is greater than or less than the width $W_B$. However, the present disclosure is not limited thereto.

It should be noted that, the thickness of the spacer material layer 118 that is formed in the step of FIG. 1C can be controlled, in order to control the width of each of the spacers 1185 and the width of each of the active stacks 162 that are formed subsequently. In addition, the positions where the spacers 1185 are formed may be determined according to the positions of the mandrel patterns 1145.

Next, referring to the FIG. 1F, FIG. 1F-1, FIG. 1F-2 and FIG. 1F-3, the sacrificial material layer 131, the anti-reflection layer 132 and the photoresist layer 30 are sequentially formed over the hard mask layer 113 (for example, formed along direction D3). The sacrificial material layer 131 may include a carbon-rich material, such as a carbon layer or spin-on carbon. In one embodiment, the sacrificial material layer 131 may completely cover the spacers 1185 and fully fill the gaps 1186 and 1187. The anti-reflection layer 132 may include silicon oxynitride.

Referring to FIG. 1F-1, FIG. 1F-2 and FIG. 1F-3, the patterned photoresist layer 30 has a special pattern. For example, the patterned photoresist layer 30 includes a main portion 30M, several wing portions 31 and several flat portions 32 on opposite sides of the main portion 30M. Specifically, in one embodiment, as shown in FIG. 1F-3, the main portion 30M has the first side 301 and the second side 302 that is opposite the first side 301. The wing portions 31 includes several first wing portions 311 on the first side 301 and several second wing portions 312 on the second side 302. The flat portions 32 include several first flat portions 321 on the first side 301 and several second flat portions 322 on the second side 302. The first wing portions 311 and the first flat portions 321 are alternately arranged in direction D1. The first wing portions 311 protrude in direction D2. The second wing portions 312 and the second flat portions 322 are alternately arranged in direction D1. The second wing portions 312 protrude in direction D4. For example, direction D4 and direction D2 may be opposite directions, but it is not limited thereto. In this exemplified embodiment, as shown in FIG. 1F-1 and FIG. 1F-3, the first flat portions 321 on the first side 301 of the main portion 30M correspond to the second wing portions 312 on the second side 302 of the main portion 30M in direction D2. The first wing portions 311 on the first side 301 of the main portion 30M correspond to the second flat portions 322 on the second side 302 of the main portion 30M in direction D2. In some embodiments, the wing portions on the opposite sides of the patterned photoresist layer 30 have completely staggered arrangement. In some other embodiments, the wing portions on the opposite sides of the patterned photoresist layer 30 can be partially staggered as shown in FIG. 1F-3, or completely correspond to each other.

As shown in FIG. 1F-3, the first wing portions 311 of the patterned photoresist layer 30 are shifted from the second wing portions 312 of the patterned photoresist layer 30 in direction D2, in accordance with some embodiments of the present disclosure. For example, the center lines $L_{C1}$ of the first wing portions 311 in direction D2 and the center lines $L_{C2}$ of the second protruding portions 312 in direction D2 are staggered from each other.

In addition, in this exemplified embodiment, although the spacers 1185 are covered by the patterned photoresist layer 30, as shown in FIG. 1F-1, the spacers 1185 in FIG. 1F-3 (and FIG. 2A and FIG. 3A in subsequent descriptions) are drawn with dashed lines in order to clearly show the relative positions of the patterned photoresist layer 30 and the underlying spacers 1185. As shown in FIG. 1F-3, each of the wing portions 31 of the patterned photoresist layer 30 covers portions of two adjacent spacers 1185 and also covers the gap (gap 1186 or gap 1187) between the two adjacent spacers 1185. Therefore, the width $W_{P1}$ of each of the first wing portions 311 in direction D1 is greater than the gap distance $W_{t1}$ between two adjacent spacers 1185, but less than the sum of twice the width $W_S$ of each of the spacers 1185 and the gap distance $W_{t1}$ between two adjacent spacers 1185. That is, $W_{t1}<W_{P1}<2\times W_S+W_{t1}$. Similarly, in this exemplified embodiment, each of the second wing portions 312 has a width of $W_{P2}$ in direction D1, and the width $W_{P2}$ of each of the second wing portions 312 in direction D1 is greater than the gap distance $W_{t1}$ between two adjacent spacers 1185, but less than the sum of twice the width $W_S$ of each of the spacers 1185 and the gap distance $W_{t1}$ between two adjacent spacers 1185; that is, $W_{t1}<W_{P2}<2\times W_S+W_{t1}$.

In one embodiment, each of the first wing portions 311 or each of the second wing portions 312 covers the gap (gap 1186 or gap 1187) between two adjacent spacers 1185, and covers about half of the two adjacent spacers 1185, as shown in FIG. 1F-3. That is, $W_{P1}=W_{P2}=W_S+W_{t1}$.

After the structure of FIG. 1F is formed, several pattern transfer processes as shown in FIG. 1G, FIG. 1H and FIG. 1I are subsequently performed for forming several gate stack layers over the substrate 100, in accordance with some embodiments of the present disclosure.

Referring to FIG. 1F, FIG. 1F-1, FIG. 1F-2, FIG. 1G and FIG. 1G-1, an etching process is performed, using the patterned photoresist layer 30 and the spacers 1185 as masks, to sequentially remove the anti-reflection layer 132, the sacrificial material layer 131 and the portions of the hard mask layer 113 that are not covered by the patterned photoresist layer 30 and the spacers 1185. The etching process is performed until the upper surface 112a of the hard mask layer 112 is exposed. In one embodiment, the forgoing etching process is a dry etching process.

It should be noted that the patterned hard mask layer 113 has a hard mask pattern 1135 after the etching process is performed. Specifically, referring to FIG. 1G-1, the pattern of the spacers 1185 is transferred to the hard mask layer 113 in the area that is not covered by the patterned photoresist layer 30. The pattern of the patterned photoresist layer 30 is transferred to the hard mask layer 113 in the area that is covered by the patterned photoresist layer 30. Therefore, a hard mask pattern 1135 is formed after the etching process is performed, in accordance with some embodiments of the present disclosure. In addition, the spacers 1185 that are not covered by the patterned photoresist layer 30 may be completely or partially consumed during the etching process, so parts of the spacers 1185' may be left on the hard mask pattern 1135. In one embodiment, after the etching process is performed, the patterned photoresist layer 30 and the anti-reflection layer 132' and the sacrificial material layer 131' that are under the patterned photoresist layer 30 are further removed.

Referring to FIG. 1G and FIG. 1H, an etching process is performed on the material layers that are under the hard mask pattern 1135 and the spacers 1185', using the hard mask pattern 1135 and the spacers 1185' (if there is any remained) as a mask, until the upper surface of the active layer 110 is exposed. For example, an etching process is performed until the upper surface 106a of the silicon nitride layer 106 is exposed. In one embodiment, the etching process is a dry etching process. As shown in FIG. 1H, the patterned hard mask layer 112 forms a hard mask pattern 1125 after the etching process is performed.

Referring to FIG. 1H and FIG. 1I, an etching process is performed on the material layers that are under the hard mask pattern 1125 using the hard mask pattern 1125 as a mask, in order to form an active layer 110' and a substrate 100'. As shown in FIG. 1I, in one embodiment, the active layer 110' includes a tunnel oxide layer 102', a conductive layer 104' and a silicon nitride layer 106'. In addition, the hard mask pattern 1125 may be partially consumed during the etching process, and a hard mask pattern 1126 is left on the active layer 110'.

Referring to FIG. 1I, FIG. 1I-1, and FIG. 1I-2, after the material layers that are under the hard mask pattern 1125 are etched using the hard mask pattern 1125 as a mask, a gate stack layer 16 is formed. The gate stack layer 16 includes an active pattern 160 and a rail block 163. In one embodiment, additional features (such as source/drain regions) may be formed over this structure to make a non-volatile memory device. The non-volatile memory is, for example, a NAND flash memory.

Referring to FIG. 1I-1 and FIG. 1I-2, the rail block 163 has the first side 1631 and the second side 1632 that is opposite the first side 1631. The first side 1631 of the rail block 163 includes several first protruding portions 1635P and several first flat portions 1635F arranged alternately in direction D1, in accordance with some embodiments of the present disclosure. The first protruding portions 1635P protrude in direction D2. Similarly, the second side 1632 of the rail block 163 includes several second protruding portions 1636P and several second flat portions 1636F arranged alternately in direction D1. The second protruding portions 1636P protrude in direction D4. In this exemplified embodiment, the first protruding portions 1635P are shifted from the second protruding portions 1636P in direction D2. For example, the first center lines $L_{G1}$ of the first protruding portions 1635P in direction D2 and the second center lines $L_{G2}$ of the second protruding portions 1636P in direction D2 are staggered from each other. In addition, the first protruding portions 1635P correspond to the second base portions 1636F in direction D2, and the first base portions 1635F correspond to the second protruding portions 1636P in direction D2. In some other embodiments, the first protruding portions 1635P are arranged in such a way that they correspond to the second protruding portions 1636P in direction D2. For example, the first base portions 1635F correspond to the second base portions 1636F, and the first protruding portions 1635P correspond to the second protruding portions 1636P (as shown in FIG. 3B).

Figure 1I:
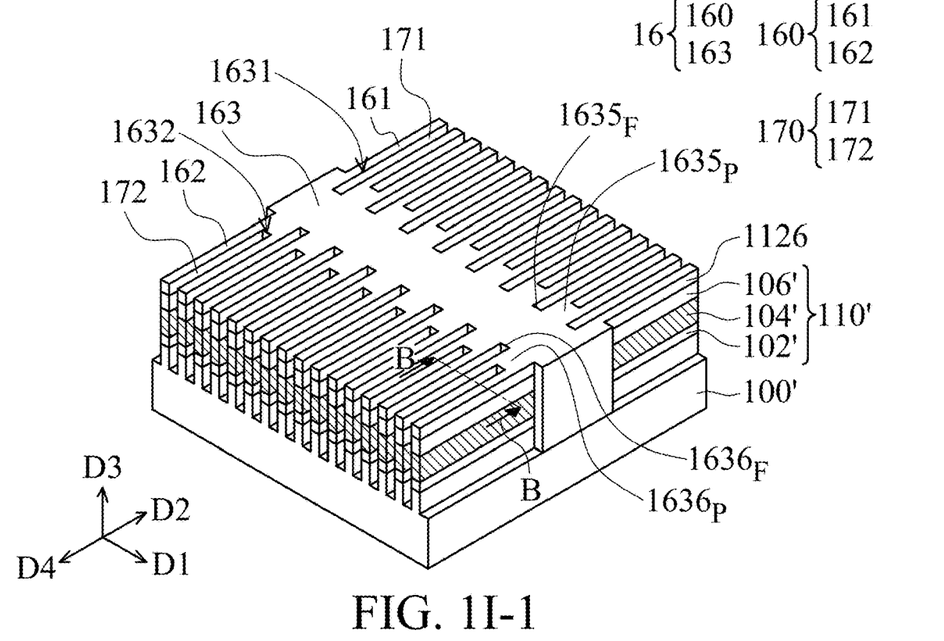
Figure 1I:
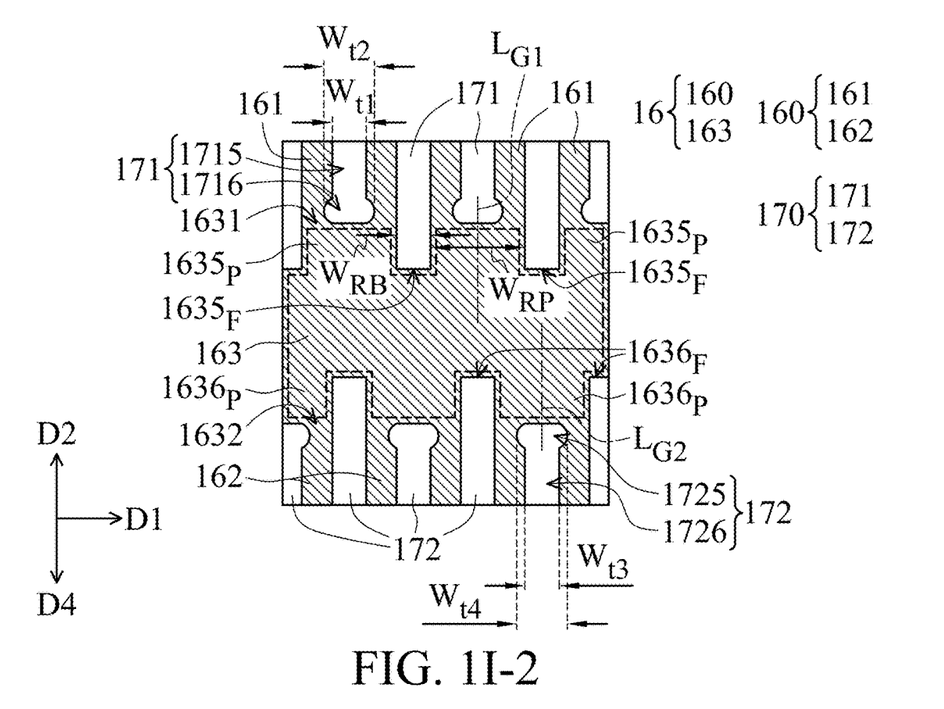

In one embodiment, the active pattern 160 of the gate stack layer 16 includes several active stacks 161 and 162 (subsequently forming memory cells) connected to the rail block 163. In this exemplified embodiment, the active stacks 161 and the active stacks 162 connect to opposite sides of the rail block 163, such as respectively connecting the first side 1631 and the second side 1632. In addition, there are trenches 170 between adjacent active patterns 160. The trenches 170 include trenches 171 and trenches 172. Specifically, the trenches 171 are positioned between adjacent active stacks 161, and the trenches 172 are positioned between adjacent active stacks 162. The active stacks 161, the active stacks 162, the trenches 171 and the trenches 172 extend, for example, along direction D2 or direction D4. In one embodiment, two adjacent trenches 171 correspond to the first base portion 1635F and the first protruding portion 1635P of the rail block 163, respectively. Two adjacent trenches 172 correspond to the second base portion 1636F and the second protruding portion 1636P of the rail block 163, respectively. In the subsequent process, the trenches 171 and the trenches 172 can be filled with an insulating material, thereby forming corresponding shallow trench isolation components (not shown).

In addition, in one embodiment, in a top view of the gate stack layer 16, the width of one end of each trench 171/172 that is connected to a protruding portion of the rail block 163 is greater than the width of the extending portion of each trench 171/172. For example, as shown in FIG. 1I-2, each of the trenches 171 includes an extending portion 1715 and an end portion 1716. The end portion 1716 connects the extending portion 1715 and the protruding portion 1635P of the first side 1631 of the rail block 163, respectively. The extending portion 1715 has a width of $W_{t1}$ in direction D1, and the maximum width of the end portion 1716 in direction D1 is defined as width $W_{t2}$. The width $W_{t2}$ is greater than the width $W_{t1}$. Each of the trenches 172 includes an extending portion 1725 and an end portion 1726. The end portion 1726 connects the extending portion 1725 and the protruding portion 1636P of the second side 1632 of the rail block 163, respectively. The extending portion 1725 has a width of $W_{t3}$ in direction D1, and the maximum width of the end portion 1726 in direction D1 is defined as width $W_{t4}$. Width $W_{t4}$ is greater than width $W_{t3}$.

It should be noted that, in a top view of the structures (as shown in FIG. 1G-2 and FIG. 1I-2), the single spacer 1185 has an end portion and an extending portion. The end portion is adjacent to both sides of each of the wing portions 31 (including the first wing portions 311 and the second wing portions 312) of the patterned photoresist layer 30. The extending portion is farther away from the patterned photoresist layer 30 than the end portion. In this exemplified embodiment, the active pattern 160 corresponds to a pattern of the extending portions of the spacers 1185, and the rail block 163 corresponds to a pattern that includes a combination of the patterned photoresist layer 30 and the end portions of the spacers 1185. According to the embodiments of the present disclosure, the connection between the active pattern 160 and the rail block 163 have a sufficient connection area, and the conventional problem of disconnection between the active pattern and the rail block can be solved. In a method for forming a memory structure, the first wing portions 311 and the second wing portions 312 of the patterned photoresist layer 30 in FIG. 1F-1 respectively correspond to the first protruding portions 1635P and the second protruding portions 1636P of the rails block 163 in FIG. 1I-1, in accordance with an embodiment of the present disclosure.

Figure 2A:
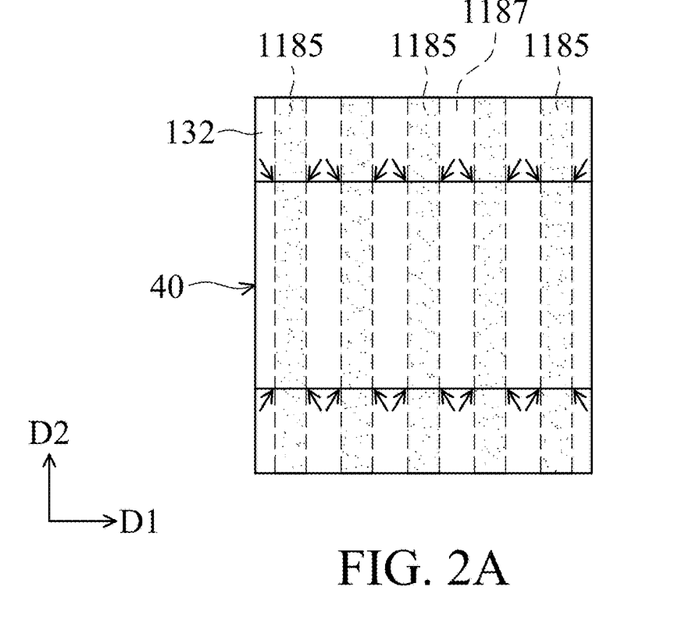
FIG. 2A is a top view of a part of a conventional patterned photoresist layer 40 that is disposed in a process step related to FIG. 1F-3.

FIG. 2A is a top view of a part of a conventional patterned photoresist layer 40 that is disposed in a process step related to FIG. 1F-3. Referring to the process steps of FIG. 1F-1, the spacers 1185 in FIG. 2A are located under the anti-reflection layer 132 and covered by the sacrificial material layer 131. The spacers 1185 are drawn with dotted lines to clearly show relative positions between the patterned photoresist layer 40 and the underlying spacers 1185. FIG. 2B is a top view after an etching process is performed on the material layers under the patterned photoresist layer 40 and the spacers 1185, using a pattern formed by a combination of the patterned photoresist layer 40 and the spacers 1185 as shown in FIG. 2A. The difference between FIG. 2A and FIG. 1F-3 is in the patterns of the patterned photoresist layers. FIG. 2B may correspond to the process step of FIG. 1G-2, and the difference between FIG. 2B and FIG. 1G-2 is in the top-view patterns that are formed after the underlying material layers are etched. For the sake of simplicity and clarity of description, the features/components in FIG. 2A and FIG. 2B similar or identical to the features/components in FIG. 1F-3 and FIG. 1G-2 are designated with similar or the same reference numbers. The details of those similar or the identical features/components can be referred to the related contents in the aforementioned descriptions.

Figure 2B:
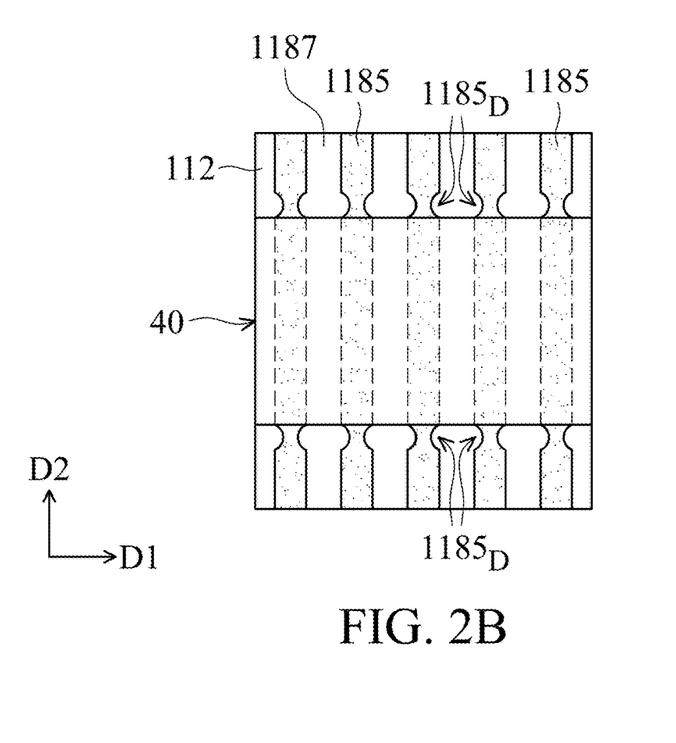
FIG. 2B is a top view of a patterned material layer after an etching process is performed using a pattern formed by a combination of the patterned photoresist layer and the spacers in FIG. 2A.

In a conventional method, an etching process is performed (for example, an etching process as described in FIG. 1G) to pattern the anti-reflection layer 132 and the sacrificial material layer 131 that are under the patterned photoresist layer 40 of FIG. 2A using the patterned photoresist layer 40 as a mask. During the etching step, when the spacers 1185 are exposed and the sacrificial material layer 131 at the gaps 1187 is to be etched, the interfaces (e.g., as indicated by the arrows in FIG. 2A) between the patterned photoresist layer 40, the spacers 1185 and the gaps 1187 are more susceptible to be attacked by etching plasma (i.e., with a faster etching rate) due to significant height differences between the edges of the patterned photoresist layer 40, the spacers 1185 and the gaps 1187. Accordingly, the spacers 1185 are over etched. As shown in FIG. 2B, the etching process would cause the spacers 1185 to have concave defects 1185D that are adjacent to the sides of the patterned photoresist layer 40. It should be noted that when the conventional patterned photoresist layer 40 is used as a mask and the concave defects 1185D are simultaneously formed on the opposite sides of a single spacer 1185 at the same position in direction D2, the concave defects 1185D may be enlarged in the subsequent processes. Therefore, in a conventional method, the pattern of the spacers may be cut off, so that the resulting active stacks are unable to connect to the rail block.

Refer to FIG. 1F-3 and FIG. 1G-2. FIG. 1G-2 is a top view of a part of the underlying material layers in an etching process using the patterned photoresist layer 30 in FIG. 1F-3 as a mask. The steps in FIG. 1F-3 and FIG. 1G-2 and the subsequent processes to transfer the pattern of the patterned photoresist layer 30 to the underlying active layer have been described in the above-mentioned forming steps in FIG. 1G, FIG. 1H and FIG. 1I, and are not repeated herein.

In this embodiment, the patterned photoresist layer 30 has the first wing portions 311 and the second wing portions 312 that protrude in direction D2 and direction D4. During the etching process, only the portions (as indicated by the arrows in FIG. 1F-3) that correspond to the gaps 1187/1186 near the first wing portions 311/the second wing portions 312 and adjacent to the edges of the patterned photoresist layer 30 are more susceptible to be attacked by etching plasma, resulting in more spacers 1185 material being etched. However, the portions that correspond to the gaps 1187/1186 near the first flat portions 321/the second flat portions 322 and adjacent to the edges of the patterned photoresist layer 30 are not over etched due to the shielding effect. Therefore, compared to a top-view pattern (as shown in FIG. 2B) that is generated by an etching process using the patterned photoresist layer 40 as provided in FIG. 2A as a mask, the top-view pattern (as shown in FIG. 1G-2) that is generated by an etching process using the patterned photoresist layer 30 as provided in FIG. 1F-3 as a mask includes concave defects 1185D that are not simultaneously formed on the opposite sides of a single spacer 1185 at the same position in direction D2. Therefore, the risk of the pattern of the spacers with cut-off defects can be prevented in the subsequent processes.

Figure 3A:
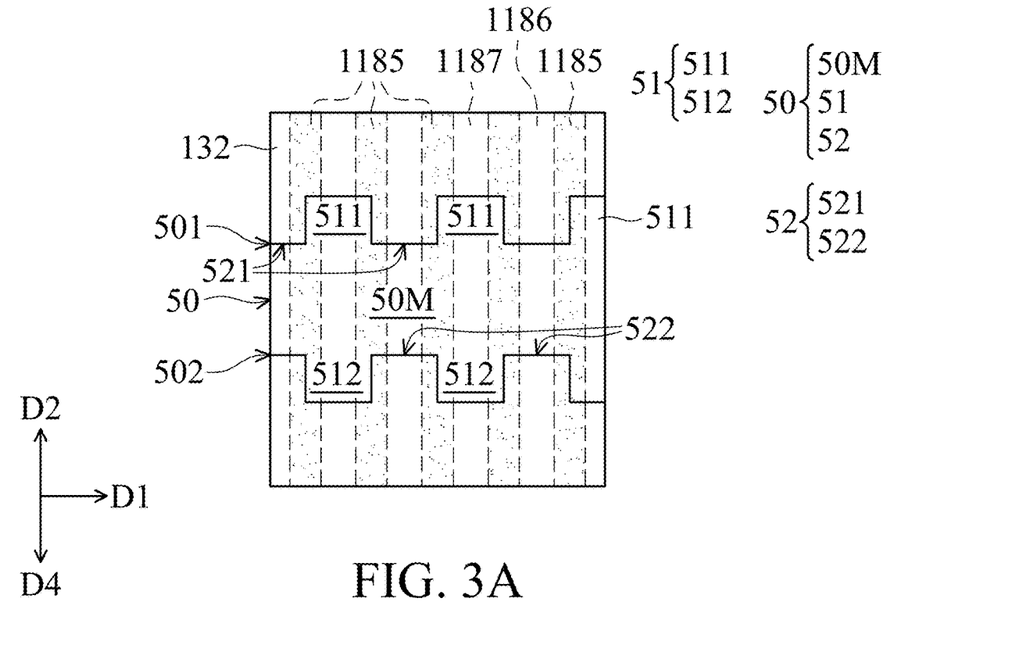
FIG. 3A is a top view of a part of a patterned photoresist layer that is disposed in a process step related to FIG. 1F-3, in accordance with some other embodiments of the present disclosure.
Figure 3B:
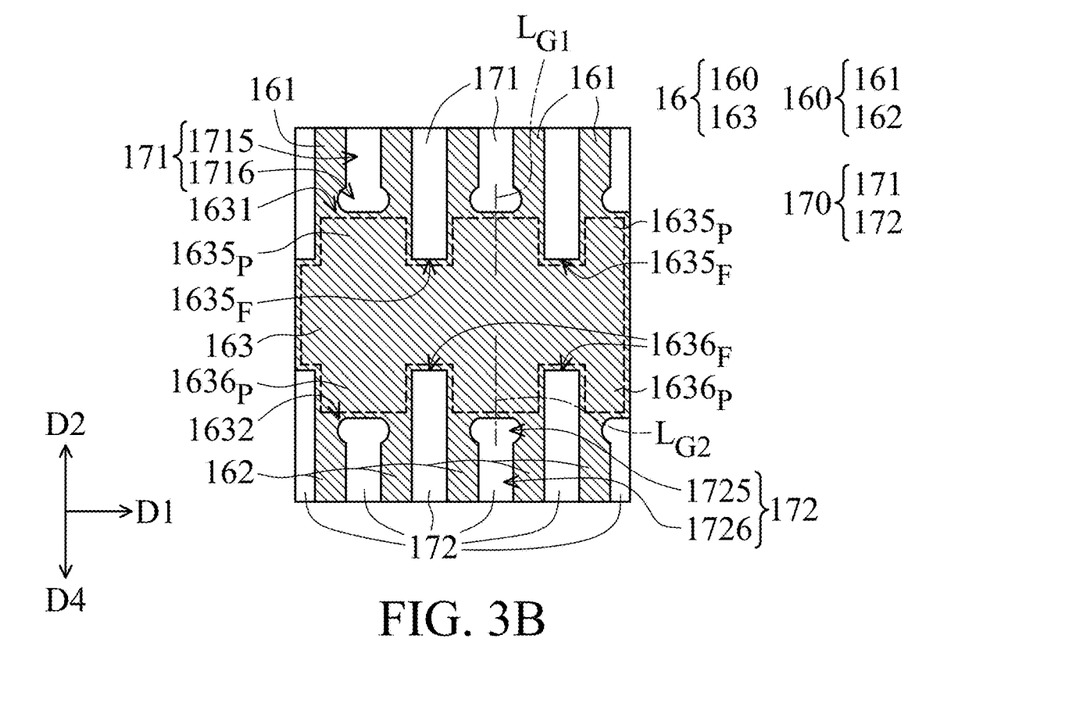
FIG. 3B is a top view of a patterned material layer after an etching process is performed using another patterned photoresist layer as a mask, in accordance with some other embodiments of the present disclosure.

FIG. 3A is a top view of a part of a patterned photoresist layer 50 that is disposed in a process step related to FIG. 1F-3, in accordance with some other embodiments of the present disclosure. The difference between FIG. 3A and FIG. 1F-3 is that the patterns of the patterned photoresist layers 50 and 30 are different. In addition, referring to the process steps of FIG. 1F-1, the spacers 1185 in FIG. 3A are positioned under the anti-reflection layer 132 and covered by the sacrificial material layer 131, so the spacers 1185 are drawn with dotted lines. FIG. 3B is a top view of a patterned material layer under the patterned photoresist layer 50 and the spacers 1185 after an etching process is performed using a combination of the patterned photoresist layer 50 and the spacers 1185 in FIG. 3A as a mask. For the sake of simplicity and clarity of description, the features/components in FIG. 3A and FIG. 3B similar or identical to the features/components in FIG. 1F-3 and FIG. 1I-2 are designated with similar or the same reference numbers. The details of those similar or the identical features/components can be referred to the related contents in the aforementioned descriptions.

Referring to FIG. 3A, the patterned photoresist layer 50 includes a main portion 50M, several wing portions 51 and several flat portions 52 on opposite sides of the main portion 50M. Specifically, in one embodiment, as shown in FIG. 3A, the main portion 50M has the first side 501 and the second side 502 that is opposite the first side 501. The wing portions 51 includes several first wing portions 511 on the first side 501 and several second wing portions 512 on the second side 502. The flat portions 52 include several first flat portions 521 on the first side 501 and several second flat portions 522 on the second side 502. The first wing portions 511 and the first flat portions 521 are alternately arranged in direction D1. The first wing portions 511 protrude in direction D2. The second wing portions 512 and the second flat portions 522 are alternately arranged in direction D1. The second wing portions 512 protrude in direction D4. For example, Direction D4 and direction D2 may be opposite directions, but it is not limited thereto. In this exemplified embodiment, the first wing portions 511 on the first side 501 of the main portion 50M correspond to the second wing portions 512 on the second side 502 of the main portion 50M in direction D2. The first flat portions 521 on the first side 501 of the main portion 50M correspond to the second flat portions 522 on the second side 502 of the main portion 50M in direction D2.

As shown in FIG. 3A, the first wing portions 511 of the patterned photoresist layer 50 correspond to the second wing portions 512 of the patterned photoresist layer 50 in direction D2, in accordance with some embodiments of the present disclosure. In this exemplified embodiment, the center lines $L_{C1}$ of the first wing portions 511 in direction D2 overlap with the center lines $L_{C2}$ of the second protruding portions 512 in direction D2.

After the material layers are patterned using a combination of the spacers 1185 and the patterned photoresist layer 50 shown in FIG. 3A as a mask, a gate stack layer 16 that includes the active pattern 160 and the rail block 163 can be obtained. FIG. 3B is a top view of a part of a gate stack layer, in accordance with some embodiments of the present disclosure. In FIG. 3B, the active pattern 160 corresponds to the pattern of the spacers 1185, and the rail block 163 corresponds to the pattern of the main portion 50M of the patterned photoresist layer 50. For the sake of simplicity and clarity of description, the features/components in FIG. 3B similar or identical to the features/components in FIG. 1I-2 are designated with similar or the same reference numbers, and the details of those similar or the identical features/components can be referred to the related contents in the aforementioned descriptions.

According to some embodiments of the present disclosure, a non-volatile memory structure and methods for forming the same can be achieved by using a patterned photoresist layer with a special pattern, so that the pattern of the patterned photoresist layer can be transferred to an active layer in the subsequent multi-process processes without adding extra cost. In addition, the gate stack layer that is formed by the method of the embodiment not only includes a rail block with sufficient area for forming contacts, but also includes several active stacks that are connected to the rail block without defects of disconnection. Accordingly, the contacts that are subsequently formed on the rail block can be electrically connected to the conductive layers (such as gate electrodes) of the active stacks. That is, the risk of disconnection can be prevented even when the resulting active stacks suffer from concave defects of material loss at the edges of the active stacks and adjacent to the rail block (as shown in FIG. 1G-2) during the etching process. Therefore, the production yield and reliability of the non-volatile memory structures that are formed by the methods of the embodiments can be greatly improved.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A non-volatile memory structure, comprising:
a substrate; and
a gate stack layer over the substrate, wherein the gate stack layer comprises:
an active pattern including a plurality of first active stacks and a plurality of second active stacks, wherein the plurality of first active stacks and the plurality of second active stacks are arranged separately in a first direction and extend in a second direction, wherein the second direction is different from the first direction; and
a rail block extending in the first direction, and having a first side and a second side opposite the first side, wherein the plurality of first active stacks connect the first side of the rail block, the plurality of second active stacks connect the second side of the rail block, and the first side of the rail block includes a plurality of first protruding portions arranged separately in the first direction.

2. The non-volatile memory structure as claimed in claim 1, wherein the second side of the rail block includes a plurality of second protruding portions, and the plurality of second protruding portions are arranged separately in the first direction.

3. The non-volatile memory structure as claimed in claim 2, wherein the plurality of first protruding portions are arranged correspondingly to the plurality of second protruding portions in the second direction.

4. The non-volatile memory structure as claimed in claim 2, wherein first center lines of the plurality of first protruding portions in the second direction overlap with second center lines of the plurality of second protruding portions in the second direction.

5. The non-volatile memory structure as claimed in claim 2, wherein the plurality of first protruding portions are shifted from the plurality of second protruding portions in the second direction, wherein first center lines of the plurality of first protruding portions in the second direction and second center lines of the plurality of second protruding portions in the second direction are staggered from each other.

6. The non-volatile memory structure as claimed in claim 2, wherein the first side of the rail block further includes a plurality of first base portions, wherein the plurality of first base portions and the plurality of first protruding portions are arranged alternately; and
the second side of the rail block further includes a plurality of second base portions, wherein the plurality of second base portions and the plurality of second protruding portions are arranged alternately.

7. The non-volatile memory structure as claimed in claim 6, wherein the plurality of first base portions correspond to the plurality of second base portions, and the plurality of first protruding portions correspond to the plurality of second protruding portions.

8. The non-volatile memory structure as claimed in claim 6, wherein the plurality of first protruding portions correspond to the plurality of second base portions, and the plurality of first base portions correspond to the plurality of second protruding portions.

9. The non-volatile memory structure as claimed in claim 6, further comprising a plurality of first shallow trench isolation components that are arranged alternately with the plurality of first active stacks, wherein the plurality of first shallow trench isolation components extend in the second direction, and two adjacent first shallow trench isolation components respectively correspond to one of the first base portions and one of the first protruding portions,
wherein each of the first shallow trench isolation components comprises:
a first elongated portion, having a first elongated width in the first direction; and
a first end portion, connecting the first elongated portion and the first side of the rail block, wherein the first end portion has a first end width in the first direction, and the first end width is greater than the first elongated width.

* * * * *